(12) United States Patent
McCune, Jr. et al.

(10) Patent No.: US 6,690,215 B2
(45) Date of Patent: Feb. 10, 2004

(54) SIGMA-DELTA-BASED FREQUENCY SYNTHESIS

(75) Inventors: Earl W. McCune, Jr., Santa Clara, CA (US); Wendell B. Sander, Los Gatos, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/942,449

(22) Filed: Aug. 29, 2001

(65) Prior Publication Data

US 2002/0043992 A1 Apr. 18, 2002

Related U.S. Application Data

(63) Continuation-in-part of application No. 09/624,574, filed on Jul. 24, 2000, which is a continuation-in-part of application No. 09/268,731, filed on Mar. 17, 1999, now Pat. No. 6,094,101.

(51) Int. Cl.$^7$ ................................................ H03L 7/00
(52) U.S. Cl. ...................................... 327/156; 327/105
(58) Field of Search ................................ 327/105, 113, 327/156, 107; 375/376

(56) References Cited

U.S. PATENT DOCUMENTS

| | | | | | |
|---|---|---|---|---|---|
| 4,965,531 | A | * | 10/1990 | Riley | 331/25 |
| 5,329,253 | A | * | 7/1994 | Ichihara | 331/17 |
| 5,604,468 | A | * | 2/1997 | Gillig | 331/176 |
| 6,249,189 | B1 | * | 6/2001 | Wu et al. | 327/105 |

FOREIGN PATENT DOCUMENTS

| | | | | |
|---|---|---|---|---|
| EP | 0 717 491 A2 | 6/1996 | | H03D/7/00 |
| WO | 01/20774 A1 | 3/2001 | | H03C/3/09 |

* cited by examiner

Primary Examiner—Dinh T. Le
(74) Attorney, Agent, or Firm—Thelen Reid & Priest LLP

(57) ABSTRACT

The present invention, generally speaking, satisfies the foregoing requirements using in combination within a frequency synthesis loop an SDM-based synthesizer and an SDM-based frequency digitizer. Since both blocks are SDM-based, the resulting signals can be differenced and filtered to produce a control signal for an oscillator. Low noise (and low spurs), fine frequency resolution and fast switching times may all be achieved simultaneously.

13 Claims, 5 Drawing Sheets

SIGMA-DELTA-BASED FREQUENCY SYNTHESIS

RELATED APPLICATIONS

This application is a continuation-in-part of U.S. application Ser. No. 09/624,574, filed Jul. 24, 2000, incorporated herein by reference, which is a continuation-in-part of U.S. patent application Ser. No. 09/268,731, filed Mar. 17, 1999, now U.S. Pat. No. 6,094,101.

BACKGROUND OF THE INVENTION

1. Field of the Invention

The present invention relates to frequency synthesis.

2. State of the Art

In the field of communications, it is necessary to synthesize many different frequencies, typically using a reference frequency or a small number of reference frequencies. A phase lock look (PLL) is used for this purpose.

The frequency to be synthesized and the reference frequency are not always related by integer relations. Fractional-N synthesis may be used in such instances. Originally, fractional-N synthesis (FNS) was used to refer to a technique in which an accumulator is used following a conventional divider. Upon accumulator rollover, the divider divides the signal by the next highest integer on its subsequent cycle. Hence, the divider divides the signal by N or N+1, with a duty cycle set by the accumulator. The feedback signal to the phase detector is therefore frequency modulated. A narrow PLL bandwidth averages the FM feedback to provide fractional resolution (between 1/N and 1/(N+1)). The arrangement of a typical fractional-N synthesizer is shown in FIG. 1, where a block 101 represents the combination divider/accumulator previously described.

More particularly, an output signal 103 of the divider/accumulator 101 is applied to a phase/frequency detector (PFD) 105, together with a reference frequency $f_{ref}$. The PFD produces an error signal 107, which is filtered using a low-pass filter 109 to produce a control signal 111 for a VCO 113. The VCO produces an output signal $f_o$, which is also applied as the input signal to the divider/accumulator 101. The elements of FIG. 1 may be grouped into a forward path 110 and a feedback path 120. In the arrangement of FIG. 1, however, discrete spurious signal components ("spurs") are typically created in the output signal.

Fractional-N synthesis may also refer, more generally, to any non-integer frequency division. One example is the use of a sigma-delta modulator (SDM) to drive the modulus control inputs of a multi-modulus prescaler, as shown in FIG. 2. In FIG. 2, a forward path 210 includes the same elements as in FIG. 1. In the feedback path 220, the divider/accumulator of FIG. 1 is replaced by a multi-modulus prescaler 221 controlled by a SDM 223. This technique also frequency modulates the feedback to the phase detector. The FM rate is much higher than in the accumulator method, so the PLL more readily averages the feedback. However, the noise component of the SDM does get through the PLL, appearing as a raised noise floor on the synthesizer output.

Both of the foregoing approaches provide finer frequency resolution than conventional integer-N PLLs, or equivalently provide lower output noise for identical resolution than integer-N PLLs. These advantages make FNS attractive. Still, the discrete spurs of the accumulator technique, or the raised noise floor of the SDM technique, leave room for improvement.

A further technique is described in U.S. Pat. Nos. 4,965,533 and 5,757,239. This technique, illustrated in FIG. 3, involves a direct digital synthesizer 301 followed by a PLL 303 set to a fixed multiplication ratio, multiplying the DDS output (having relatively fine frequency resolution). A typical DDS arrangement is shown in FIG. 4. An arithmetic circuit 410 comprises an adder 401 and an N-bit accumulator 403 connected in the manner shown. In particular, an N-bit input value M and the N-bit output of the accumulator 403 are applied to the adder 401. The adder produces an N-bit result (excluding carry bit). The accumulator 403 is updated with the adder output in accordance with $F_{CLK}$. The output value of the accumulator 403 is used to address a ROM 405. The ROM 405 produces a digital value which is converted to analog by a DAC 407 and low pass filtered using a LPF 409 to produce an output signal. The frequency of the output signal is that of $F_{CLK}$ scaled by the ratio $M:2^N$.

Using the technique of FIG. 3, spurious signals in the DDS output signal are either filtered by the PLL (if outside the PLL's bandwidth) or multiplied by the PLL (if within its bandwidth). Thus, this technique is also susceptible to noise degradation.

Although not widely known, a DDS-like arrangement can be operated as a first-order SDM, as shown in FIG. 5. An arithmetic circuit 510 is similar to the arithmetic circuit 410 of FIG. 4 except that a carry-out signal $c_o$ of the adder 501 is synchronized with $f_{CLK}$ to form a signal $c_o'$, which is the desired SD waveform. As compared to the conventional DDS arrangement of FIG. 4, the SD waveform of FIG. 5 has a duty cycle of $f_o$: $f_{CLK}$, or $M:2^N$.

In addition, a wideband frequency digitizer is described in U.S. Pat. No. 6,219,394 entitled DIGITAL FREQUENCY SAMPLING AND DISCRIMINATION issued Apr. 17, 2001 and incorporated herein by reference. As illustrated in FIG. 6, the wideband frequency digitizer 601 provides a sigma-delta waveform representation 603 of the frequency ratio between its input signal $f_x$ (605) and a reference $F_{CLK}$ (607).

Despite the foregoing techniques, a need exists for a frequency synthesis technique that simultaneously provides low noise (and low spurs) while also providing fine frequency resolution and fast switching times.

SUMMARY OF THE INVENTION

The present invention, generally speaking, satisfies the foregoing requirements using in combination within a frequency synthesis loop an SDM-based synthesizer and an SDM-based frequency digitizer. Since both blocks are SDM-based, the resulting signals can be differenced and filtered to produce a control signal for an oscillator. Low noise (and low spurs), fine frequency resolution and fast switching times may all be achieved simultaneously.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
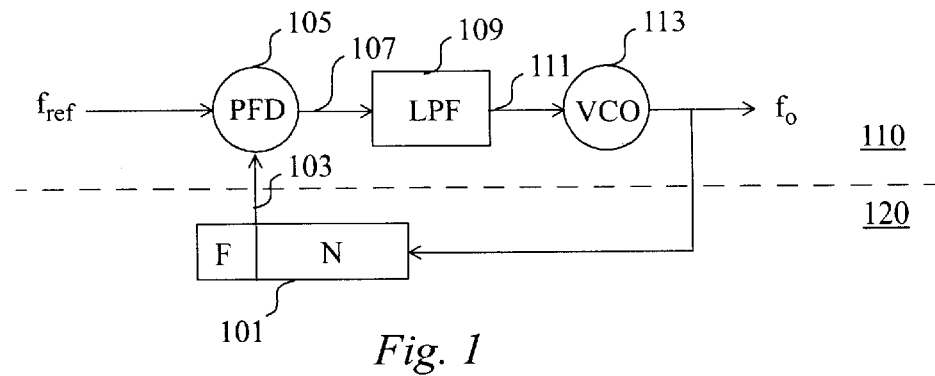
FIG. 1 shows the arrangement of a conventional fractional-N synthesizer.
Figure 2:
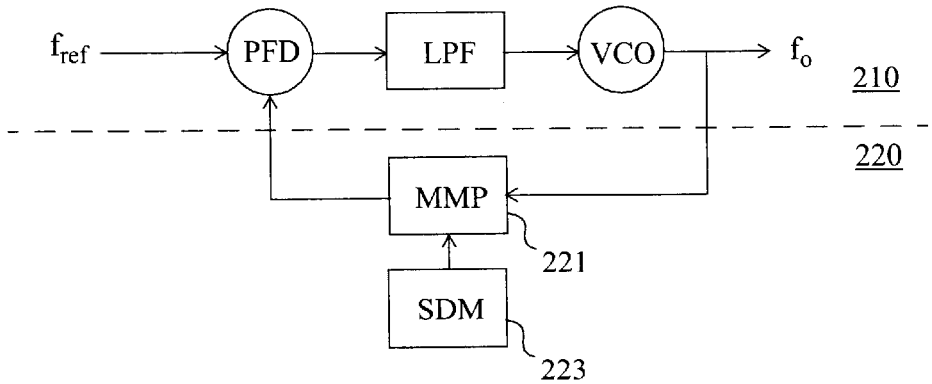
FIG. 2 shows the use of a sigma-delta modulator (SDM) to drive the modulus control inputs of a multi-modulus prescaler.
Figure 3:
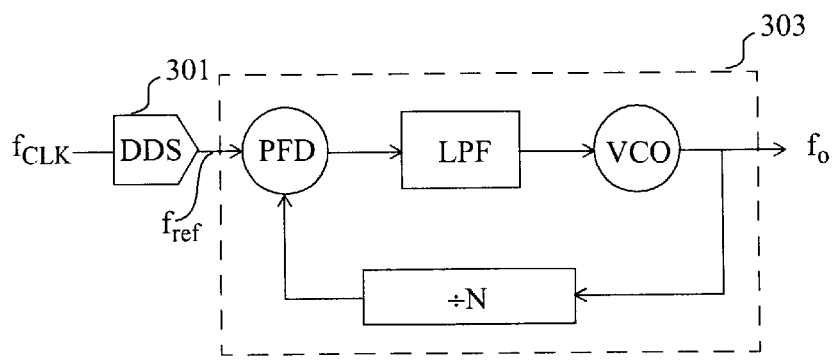
FIG. 3 shows a synthesizer in which a direct digital synthesizer is followed by a PLL set to a fixed multiplication ratio, multiplying the DDS output.
Figure 4:
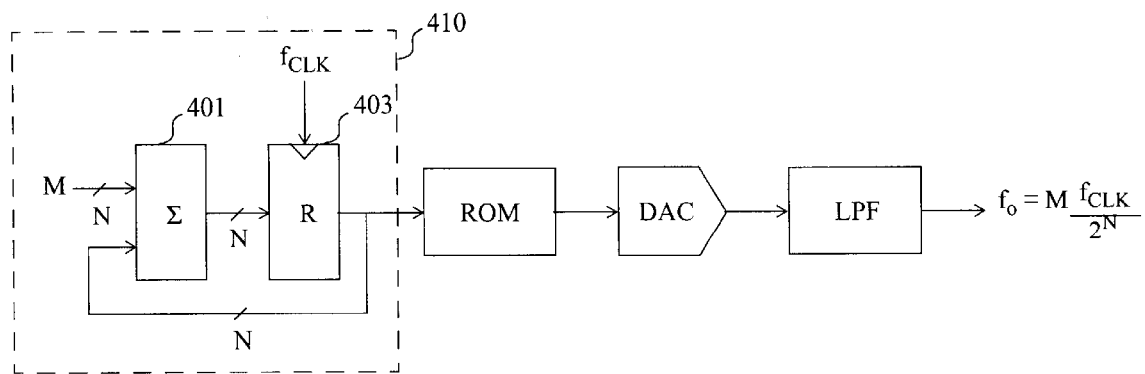
FIG. 4 shows a typical DDS arrangement.
Figure 5:
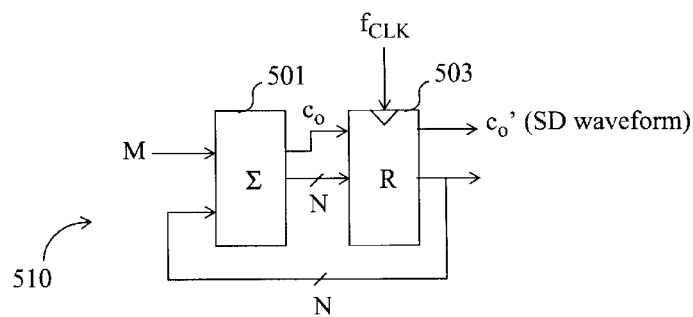
FIG. 5 illustrates a DDS-like arrangement operated as a first-order SDM.
Figure 6:
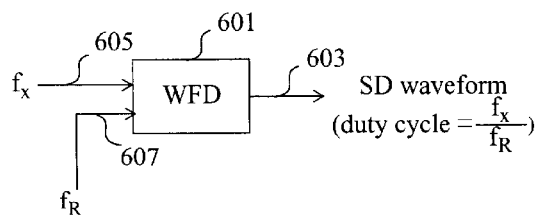
FIG. 6 illustrates a wideband frequency digitizer that provides a sigma-delta waveform representation of the frequency ratio between its input signal and a reference.
Figure 7:
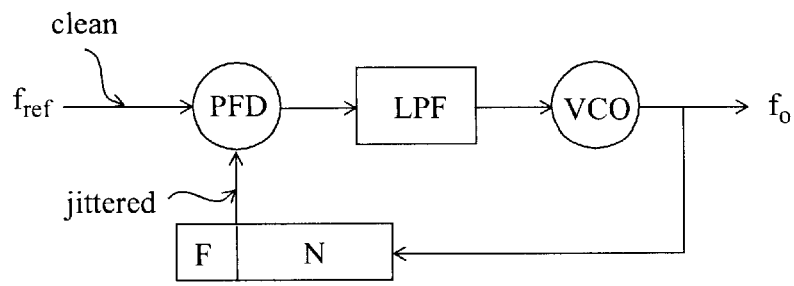
FIG. 7 illustrates a frequency synthesizer like that of FIG. 1, explicitly drawing attention to the asymmetry inherent in its operation.
Figure 8:
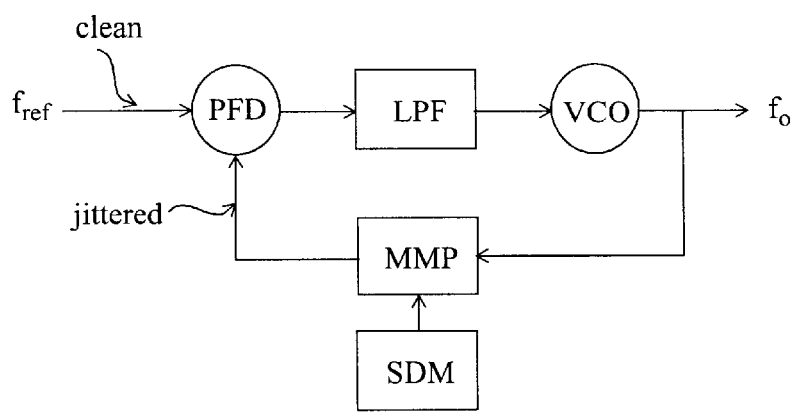
FIG. 8 illustrates a frequency synthesizer like that of FIG. 2, explicitly drawing attention to the asymmetry inherent in its operation.
Figure 9:
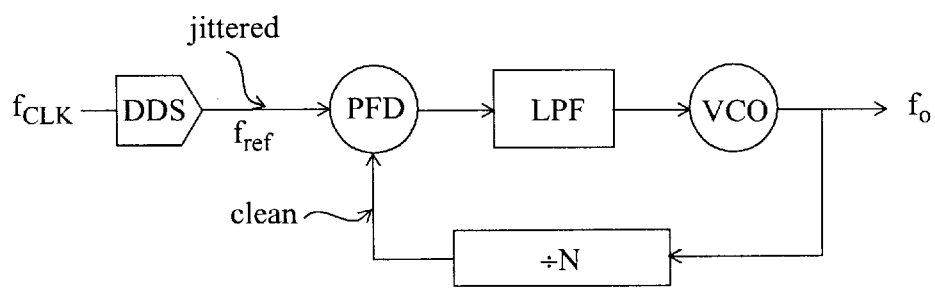
FIG. 9 illustrates a frequency synthesizer like that of FIG. 3, explicitly drawing attention to the asymmetry inherent in its operation.

The present invention is based in part on the recognition that the noise problems of the foregoing prior art techniques derive from the fact that the synthesizer phase detector (PD) is not operated symmetrically. That is, one PD input is jittered while the other is not. This asymmetry is indicated in FIG. 7, FIG. 8 and FIG. 9 (corresponding to FIG. 1, FIG. 2, and FIG. 3, respectively).

If instead both inputs to the PD are jittered by equivalent processes, their difference will ideally be zero, removing the noise otherwise contributed by asymmetric operation.

Figure 10:
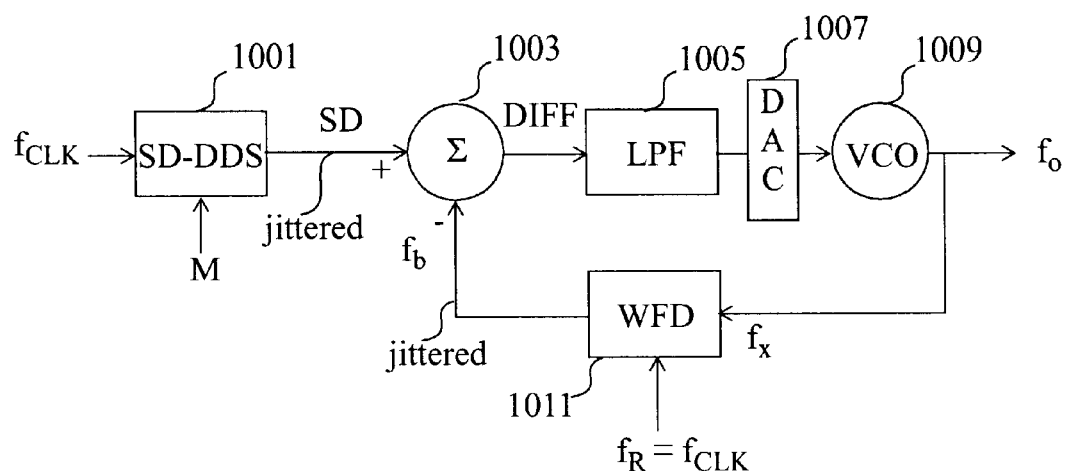
FIG. 10 is a block diagram is shown of an exemplary embodiment of the present frequency synthesizer.

Referring now to FIG. 10, a block diagram is shown of an exemplary embodiment of the present frequency synthesizer. A DDS circuit 1001 receives a clock input $F_{CLK}$ and a control input M and produces a sigma-delta output signal waveform DDS. The signal DDS is applied to a difference-forming circuit 1003 that produces as a difference signal a sigma-delta waveform DIFF. The difference signal DIFF is filtered using, for example, a digital low-pass filter 1005. The filter output signal is converted to analog using a DAC 1007 and applied to a VCO 1009, which produces an output signal $f_o$.

The output signal $f_o$ is applied to a WFD 1011, which produces a sigma-delta output signal $f_b$ based on applied reference $f_R$. This signal is applied to an input of the difference-forming circuit 1003.

At lock, in terms of duty cycles, SD=$f_b$; i.e., the stream of ones and zeros from the SD-DDS will be the same as the stream of ones and zeros from the WFD. Equating the expression for duty cycle for the DDS and WFD, and assuming $F_{CLK}=f_R$, then $$f_0 = M \cdot \frac{f_{CLK}}{2^N}$$

as in a conventional DDS. Thus, the circuit of FIG. 10 is functionally interchangeable with the ROM/DAC/LPF of a conventional DDS. The circuit of FIG. 10, however, offers the advantages of smaller size and lower power (although the use of feedback does impose some dynamic performance limitations).

The WFD has an interesting further property that may be taken advantage of. Consider different frequency ranges, 0 to $1f_R$, $1f_R$ to $2f_R$, etc. When the input frequency is within the first range, the output of the WFD will be a stream of ones and zeros, the duty cycle varying from mostly zeros at lower frequencies within the octave and mostly ones at higher frequencies within the octave. When the input frequency is within the second range, the output of the WFD will be a stream of ones and twos, the duty cycle varying from mostly ones at lower frequencies within the range and mostly twos at higher frequencies within the range, etc. The variation of the duty cycle, however, is essentially identical within different octaves. One way to express this property is that the WFD "modes," meaning that if $f_o>f_R$, then there is an offset on the digital signal of $$G = \left\lfloor \frac{f_o}{f_{ref}} \right\rfloor$$

(the greatest integer) generated internally. If this offset is removed, (e.g., by taking only the least-significant bit from the WFD), then the digital signal is the same as it would have been if the input frequency were within the first range. A synthesizer in which the offset is removed (by circuit 1101) is illustrated in FIG. 11.

Figure 11:
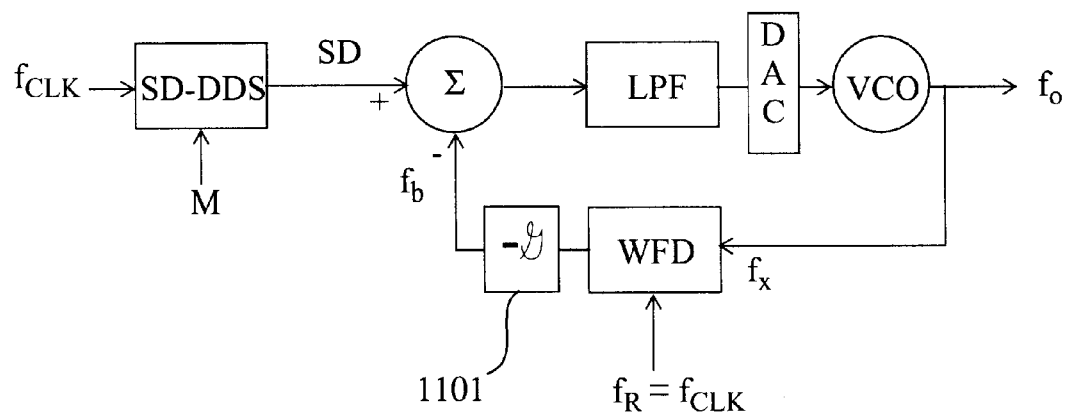
FIG. 11 shows a synthesizer using a WFD in which any offset produced by moding is removed.

The synthesizer of FIG. 11 offers a distinct advantage over a synthesizer using a conventional prescaler. Using a conventional prescaler, because the synthesizer behaves as a multiplier, when the output frequency is changed but the modulation range is to remain the same, the modulation control signal must be adjusted accordingly. In the synthesizer of FIG. 11, the modulation control signal can remain unchanged, independent of the actual output frequency. That is, the modulation control signal need not be scaled according to output frequency as is the case with the use of frequency prescalers.

Figure 12:
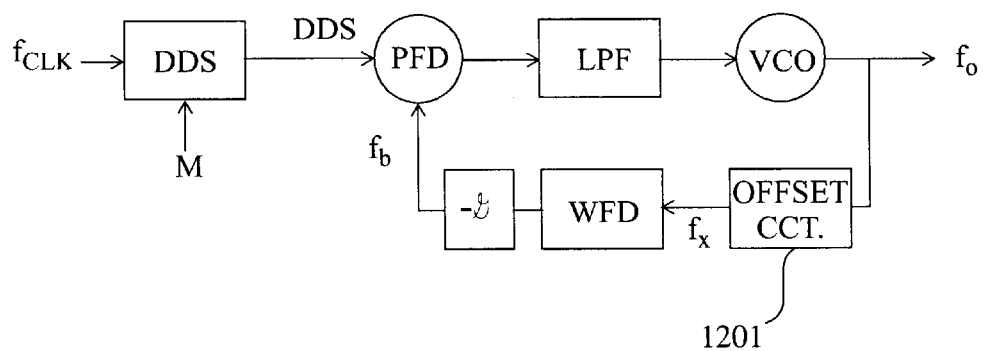
FIG. 12 shows a synthesizer like that of FIG. 11 but incorporating an offset circuit.
Figure 13:
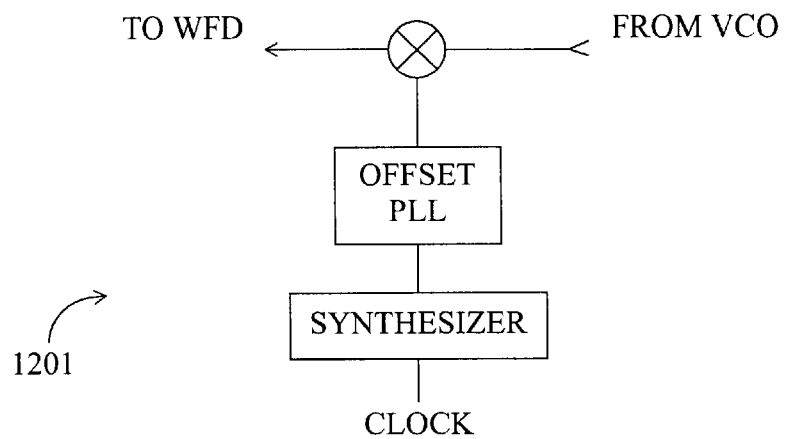
FIG. 13 is a diagram of an offset circuit suitable for use in the synthesizer of FIG. 12.

In the synthesizer of FIG. 11, the modulation control signal is the numeric control signal M. Hence, if at a first output frequency, modulation is imparted by varying M within a predetermined range, then at a second different output frequency, identical modulation may be imparted by varying M within the same predetermined range. The output frequency of the oscillator may be changed, for example, by incorporating within the feedback loop an offset circuit 1201 as shown in FIG. 12. One suitable offset circuit is shown in FIG. 13. The PLL acts to keep the output frequency of the offset circuit fixed; i.e., if the offset of the offset circuit is increased, then the frequency of the oscillator is increased by an equal amount. Similarly, if the offset of the offset circuit is decreased, then the frequency of the oscillator is decreased by an equal amount.

Note that a prescaler may be used in place of the offset circuit previously described, although modulation scaling is then required.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A method of frequency synthesis using an oscillator, comprising:
    using a first clock signal, generating a digital sigma-delta-modulated reference signal;

using a second clock signal having a frequency $f_R$, generating a digital sigma-delta-modulated signal representation from an output signal of the oscillator;

generating a difference signal responsive to the digital sigma-delta-modulated reference signal and the digital sigma-delta-modulated signal representation;

filtering the difference signal to form a filtered difference signal; and controlling the oscillator using the filtered difference signal.

2. The method of claim 1, wherein the digital sigma-delta-modulated signal representation has a duty cycle that varies identically within different frequency octaves of the output signal of the oscillator, said frequency octaves defined by frequency ranges of f to (f+n*$f_R$), where f<$f_R$, and n is a non-negative integer.

3. The method of claim 2, further comprising:

at a first output frequency of said output signal, effecting modulation on the output signal by varying a numeric control signal within a predetermined range;

deriving from the output signal of the oscillator a derived signal having a first frequency;

changing the frequency of the derived signal ; and effecting the same modulation on the output signal of the oscillator by varying the numeric control signal within the same predetermined range.

4. A frequency synthesizer comprising:

an oscillator;

means for generating a digital sigma-delta-modulated reference signal;

means for generating a digital sigma-delta-modulated signal representation from an output signal of the oscillator;

means for generating a difference signal responsive to the digital sigma-delta-modulated reference signal and the digital sigma-delta-modulated signal representation; and a filter responsive to the difference signal for generating a filtered difference signal, the filtered difference signal being applied to the oscillator to control the oscillator.

5. A circuit including a feedback loop for tracking an input signal, comprising:

an controlled oscillator;

an error generating circuit;

means for generating a digital reference signal having a duty cycle representing a frequency used to determine a predetermined output frequency of an output signal of the controlled oscillator; and a feedback circuit coupled to the controlled oscillator for generating a digital feedback signal having a duty cycle representing the frequency of the output signal of the controlled oscillator;

wherein the digital reference signal and the feedback signal are applied to the error generating circuit, which forms an error signal for controlling the controlled oscillator.

6. The circuit of claim 5, wherein the means for generating a digital reference signal comprises a direct digital synthesizer.

7. The circuit of claim 5, wherein the digital reference signal is a digital sigma-delta waveform.

8. The circuit of claim 5, wherein the feedback circuit comprises a frequency digitizer.

9. The circuit of claim 8, wherein the frequency digitizer is responsive to the output signal to produce said digital feedback signal comprising a digital sigma-delta waveform representing the frequency of the output signal.

10. The circuit of claim 9, wherein the digital sigma-delta waveform representation has a duty cycle that varies identically within frequency octaves of the output signal, said frequency octaves defined by frequency ranges of to f+n*$f_R$, where f<$f_R$, and n is a non-negative integer.

11. The circuit of claim 10, wherein the feedback circuit further comprises means for modifying the digital sigma-delta waveform representation, when the frequency of the output signal is within a given octave, such that a resulting modified digital sigma-delta waveform representation is the same as would be generated if the frequency of the output signal were within a different octave.

12. The circuit of claim 11, further comprising a frequency translation circuit, for changing the output frequency of the controlled oscillator to the feedback circuit.

13. The circuit of claim 12, wherein the frequency translation circuit comprises a prescaler.

* * * * *

UNITED STATES PATENT AND TRADEMARK OFFICE
CERTIFICATE OF CORRECTION

PATENT NO. : 6,690,215 B2
DATED : February 10, 2004
INVENTOR(S) : Earl W. McCune, Jr. and Wendell B. Sander It is certified that error appears in the above-identified patent and that said Letters Patent is hereby corrected as shown below:

<u>Column 6,</u>
Line 3, replace "an" with -- a --.
Line 13, before "feedback" add -- digital --.

Signed and Sealed this

Third Day of August, 2004

JON W. DUDAS
*Acting Director of the United States Patent and Trademark Office*